United States Patent
Wei et al.

(10) Patent No.: US 12,205,929 B2
(45) Date of Patent: Jan. 21, 2025

(54) SPLICED DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Quping Wei, Hubei (CN); Wenxu Xianyu, Hubei (CN); Chunpeng Zhang, Hubei (CN); Tiyao Ma, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/618,457

(22) PCT Filed: Nov. 12, 2021

(86) PCT No.: PCT/CN2021/130297
§ 371 (c)(1),
(2) Date: Dec. 11, 2021

(87) PCT Pub. No.: WO2023/077546
PCT Pub. Date: May 11, 2023

(65) Prior Publication Data
US 2024/0014183 A1    Jan. 11, 2024

(30) Foreign Application Priority Data
Nov. 2, 2021 (CN) .......................... 202111288400.3

(51) Int. Cl.
*H01L 25/075* (2006.01)
*H01L 25/16* (2023.01)
*H01L 33/62* (2010.01)

(52) U.S. Cl.
CPC ........ *H01L 25/0753* (2013.01); *H01L 25/167* (2013.01); *H01L 33/62* (2013.01)

(58) Field of Classification Search
CPC ... H01L 25/0753; H01L 25/167; H01L 33/62; G09G 3/32; H10K 59/10; G09F 9/302
See application file for complete search history.

(56) References Cited

U.S. PATENT DOCUMENTS

2001/0012570 A1* 8/2001 Egitto ...................... C23C 8/00
                                                                428/615
2010/0066682 A1* 3/2010 Tseng ...................... G06F 3/041
                                                                345/173
2024/0047363 A1* 2/2024 Yue ...................... H01L 21/4857

FOREIGN PATENT DOCUMENTS

CN    103717050 A    4/2014
CN    103907190 A    7/2014
(Continued)

*Primary Examiner* — Yasser A Abdelaziez
(74) *Attorney, Agent, or Firm* — PV IP PC; Wei Te Chung

(57) ABSTRACT

A display device and a spliced display panel are provided. The spliced display panel has: a display assembly, where the display assembly includes a display substrate and first connection terminals electrically connected to the display substrate; a driving backplane, where the display assembly is arranged on the driving backplane; the driving backplane includes a communication circuit layer located in the display area, the communication circuit layer includes second connection terminals bound to the first connection terminals; and a driving integrated circuit electrically connected to the second connection terminals.

20 Claims, 6 Drawing Sheets

(56) References Cited

FOREIGN PATENT DOCUMENTS

| | | | |
|---|---:|---|---:|
| CN | 109888085 | A | 6/2019 |
| CN | 111403447 | A | 7/2020 |
| CN | 111681610 | A | 9/2020 |
| CN | 113424323 | A | 9/2021 |
| CN | 113451365 | A | 9/2021 |
| JP | 2016206542 | A | 12/2016 |
| WO | WO 2021/213815 | * | 10/2021 |

* cited by examiner

SPLICED DISPLAY PANEL AND DISPLAY DEVICE

FIELD OF DISCLOSURE

The present disclosure relates to displays, and more particularly to a spliced display panel and a display device.

BACKGROUND OF DISCLOSURE

With the development of display technology, flexible organic light emitting diode (OLED) technology with high resolution and high refresh rate has gradually become the mainstream display technology. At present, OLED technology has been widely used in mobile phones, tablets, notebook computers and other fields. However, due to the low temperature poly-silicon (LTPS) device characteristics of flexible OLEDs, the maximum size of OLEDs is less than 20 inches, which is not suitable for large-size home appliances, electronic products, automobiles, medical and other fields.

At present, large-size OLED displays are mainly realized by splicing technology. In the existing disclosure, there are problems such as a large frame, difficult technical realization, and complicated procedures.

SUMMARY OF DISCLOSURE

Therefore, the existing large-size spliced display screens have relatively large frames and complicated processes that need to be resolved in this application.

The application also provides a display device including a spliced display panel.

In order to solve the above problems, the technical solutions provided by this application are as follows:

This application provides a spliced display panel, including:
  a display assembly, wherein the display assembly includes a display substrate and a plurality of first connection terminals electrically connected to the display substrate;
  a driving backplane, wherein the display assembly is arranged on the driving backplane, the driving backplane includes a communication circuit layer, and the communication circuit layer includes a plurality of second connection terminals bound to the first connection terminals; and
  a driving integrated circuit electrically connected to the second connection terminals,
  wherein the driving integrated circuit sequentially transmits signals to the first connection terminals and the display substrate through the second connection terminals to drive the display substrate, so as to drive the display substrate to emit light.

In an optional embodiment of the present application, the first connection terminals and the second connection terminals are electrically connected together by a conductive material.

In an optional embodiment of the present application, the conductive material is one or more of conductive adhesive film, conductive adhesive, metal solder, tin paste, and liquid metal.

In an optional embodiment of the present application, the conductive adhesive is a polymer conductive adhesive or a conductive adhesive doped with conductive particles.

In an optional embodiment of the present application, the doped conductive particles are one of metal particles, graphene, carbon nanotubes, and carbon fibers; wherein the metal particles include: metal single particles; metal alloy particles composed of at least two of the metal single particles; metal oxide particles composed of at least one of the metal single particles and oxygen and a metal composite material, where the metal single particles include one of gold, silver, copper, and aluminum, and the metal composite material is composed of a metal oxide; a composite material composed of at least two of metal alloys and metal single particles, composite materials composed of different types of metal oxides, or composite materials composed of different types of metal alloys.

In an optional embodiment of the present application, the metal solder is an alloy solder composed of at least two metals among Bi-based, In-based, Sn-based, and Pb-based metals.

In an optional embodiment of the present application, the spliced display panel further includes a display area and a non-display area located outside the display area, the communication circuit layer and the display component are both located in the display area, and the driving backplane further includes a substrate layer, wherein the communication circuit layer and the driving integrated circuit are both formed on the substrate layer.

In an optional embodiment of the present application, the communication circuit layer further includes connection wires located in the display area, a first interlayer insulating layer and a second interlayer insulating layer, the first interlayer insulating layer is formed on the substrate layer, the connection wires are formed on the first interlayer insulating layer, the second interlayer insulating layer is formed on the connection wires, the second connection terminals are electrically connected to the connection wires and the second connection terminals through a first via hole penetrating the second interlayer insulating layer, the driving integrated circuit is located in the non-display area and is electrically connected to the connection wires, and orthographic projections of the driving integrated circuit and the connection wires on the substrate layer do not overlap each other.

In an optional embodiment of the present application, the display substrate includes:
  a base substrate;
  a driving circuit layer disposed on a side of the base substrate away from the driving backplane, wherein the driving circuit layer is electrically connected to the first connection terminals; and
  a light emitting functional layer, wherein the first connection terminals are located on a surface of the base substrate facing the driving backplane and are electrically connected to the light emitting functional layer.

In an optional embodiment of the present application, the communication circuit layer further includes a driving function layer located in the display area, the second connection terminals are electrically connected to the driving function layer through a first via hole opened in the communication circuit layer, the driving integrated circuit is located in the non-display area and is in electrical contact with the driving function layer, and orthographic projections of the driving integrated circuit and the driving function layer on the substrate layer do not overlap each other.

In an optional embodiment of the present application, the communication circuit layer further includes a driving function layer located in the display area, the second connection terminal is electrically connected to the driving function layer through the first via hole, the driving integrated circuit is formed on the substrate layer located in the display area, the communication circuit layer is located on the driving integrated circuit and the communication circuit layer is further provided with a sixth via hole, and the driving integrated circuit is electrically connected to the driving function layer through the sixth via hole.

The application also provides a display device, including:
a housing with a receiving cavity; and
a spliced display panel described above, where the spliced display panel is arranged in the receiving cavity.

In the spliced display panel of the display device provided in this application, multiple display components with light emitting function are bound to the driving backplane with driving function. The first connection terminals are disposed on the display assembly. The signal line and the second connection terminals are disposed on the driving backplane. The signal line is electrically connected with the second connection terminals and is electrically connected with the first connection terminals. Then, a driving integrated circuit is electrically connected with the signal line, so as to transmit the signal to the display component to drive the display component to emit light. There are fewer splicing processes, and multiple small-sized display components can be spliced together easily. Moreover, multiple small-sized display components can be spliced into various shapes according to actual needs to realize large-size seamless splicing display and multi-modal splicing display. In addition, by not providing the driving function layer or arranging the driving function layer and/or the driving integrated circuit in the communication circuit layer of the driving backplane, a size of a frame can be reduced, and even zero frame splicing can be realized.

DESCRIPTION OF DRAWINGS

In order to explain the technical solutions in the embodiments of the present application more clearly, the following will briefly introduce the drawings needed in the description of the embodiments. Obviously, the drawings in the following description are only some embodiments of the present application. For those skilled in the art, without creative work, other drawings can be obtained from these drawings.

DETAILED DESCRIPTION OF PREFERRED EMBODIMENTS

Figure 1:
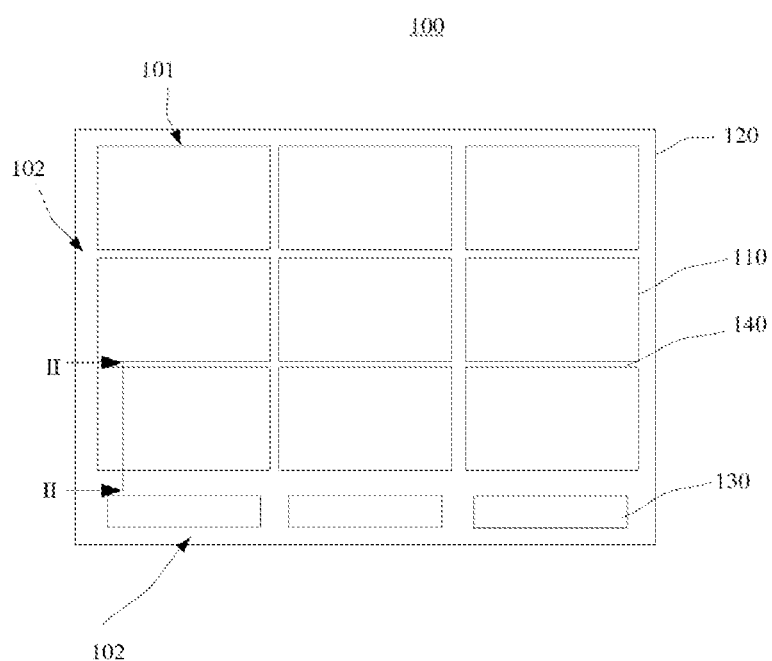
FIG. 1 is a top view of a spliced display panel provided by a first embodiment of this application.

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

In the description of this application, it should be understood that the orientation or positional relationship indicated by the terms "upper", "lower", etc. is based on the orientation or positional relationship shown in the drawings, and is only for the convenience of describing the application and simplifying the description. It does not indicate or imply that the pointed device or element must have a specific orientation, be constructed and operated in a specific orientation, and therefore cannot be understood as a limitation of the present application. In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present application, "plurality" means two or more, unless otherwise specifically defined.

This application may repeat reference numerals and/or reference letters in different implementations, and this repetition is for the purpose of simplification and clarity, and does not indicate the relationship between the various embodiments and/or settings discussed.

The present application addresses technical problems of large frame size and complicated process in the spliced display panel of the existing display device. This application binds a plurality of display components with light emitting function to a driving backplane with driving function. The first connection terminals are disposed on the display assembly. The second connection terminals are disposed on the driving backplane. The second connection terminals are electrically connected to the first connection terminals. The driving integrated circuit is electrically connected to the second connection terminals, thereby transmitting the signal in the driving integrated circuit to the display assembly, so as to drive the display components to emit light. There are fewer splicing processes, multiple small-size display components can be easily spliced together, and multiple small-size display components can be spliced into various shapes according to actual needs, so as to realize large-size seamless splicing display and multi-modal splicing display. In addition, by not providing the driving function layer or arranging the driving function layer and/or the driving integrated circuit in the communication circuit layer of the driving backplane, a size of a frame can be reduced, and even zero frame splicing can be realized.

The spliced display panel and display device of the present application will be described in detail below in conjunction with specific embodiments.

Figure 2:
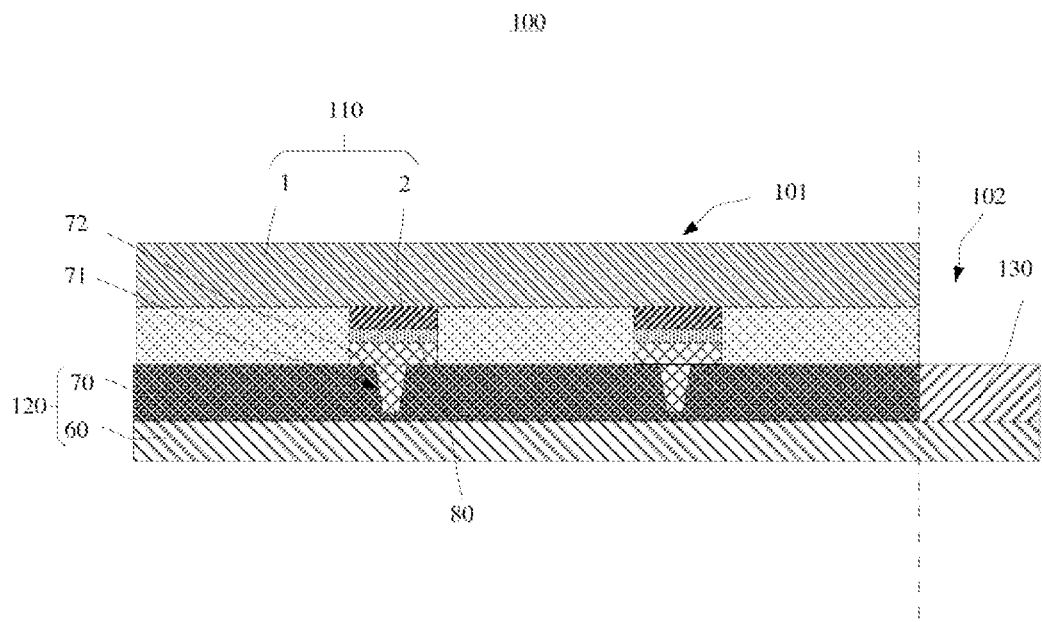
FIG. 2 is a schematic cross-sectional view taken along II-II in FIG. 1.

Referring to FIGS. 1-2, the first embodiment of the present application provides a spliced display panel 100. The spliced display panel 100 includes a display area 101 and a non-display area 102 located outside the display area 101. The spliced display panel 100 further includes a plurality of display components 110, a driving backplane 120, and a driving integrated circuit 130. A plurality of the display components 110 are located in the display area 101, and each of the display components 110 includes a plurality of first connection terminals 2 and a display substrate 1 electrically connected to the first connection terminals 2. The first connection terminals 2 are located on a surface of the display substrate 1 facing the driving backplane 120. A plurality of the display components 110 are arranged on the driving backplane 120 in an array. The driving backplane 120 includes a communication circuit layer 70 located in the display area 101. The communication circuit layer 70 includes a plurality of second connection terminals 72. The first connection terminals 2 are electrically connected to the second connection terminals 72. The driving integrated circuit 130 is electrically connected to the second connection terminal 72. The driving integrated circuit 130 sequentially transmits signals to the first connection terminals 2 and the display substrate 1 through the second connection terminals 72 to drive the display substrate 1 to emit light.

Please refer to FIG. 1 again. In this embodiment, there is an assembly gap 140 between two adjacent display assemblies 110. Since the plurality of driving integrated circuits 130 are all located in the non-display area 102 instead of being arranged in the assembly gap 140, the assembly gap 140 can be reduced, and even seamless splicing can be achieved. In this embodiment, multiple display components 110 in a same column correspond to one driving integrated circuit 130. That is, one driving integrated circuit 130 can simultaneously control multiple display components 110 in the same column to emit light of a same color and brightness.

Of course, in other embodiments, one driving integrated circuit 130 can simultaneously control all or part of the display components 110 to emit light of the same color and brightness. Specifically, it can be set according to actual conditions.

Figure 3:
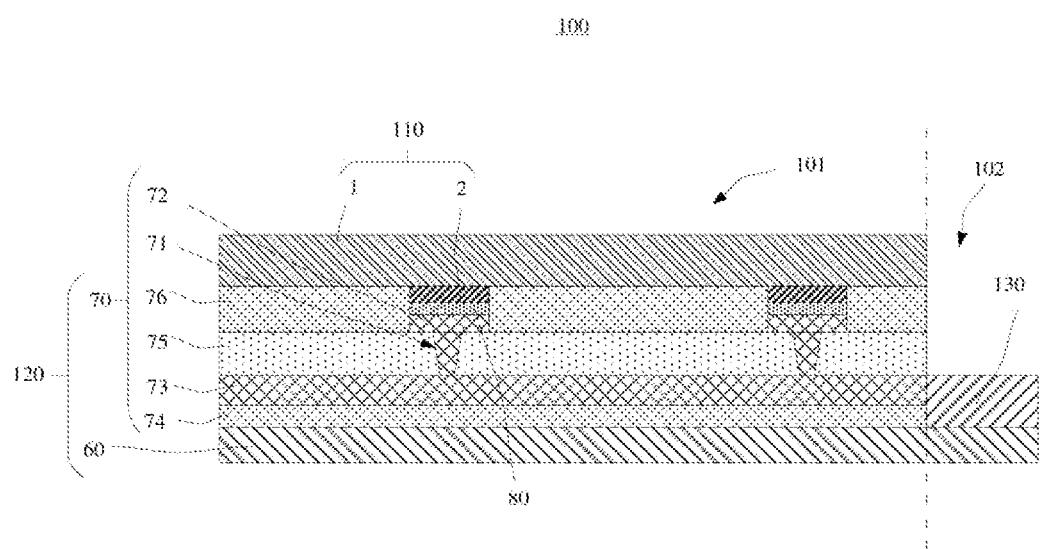
FIG. 3 is a simple cross-sectional schematic diagram of the spliced display panel with a film structure with a driving backplane shown in FIG. 2.

Please refer to FIG. 3. In this embodiment, the communication circuit layer 70 also includes connection wires 73, a first interlayer insulating layer 74, a second interlayer insulating layer 75, and a sealing adhesive layer 76. The connection wires 73 are formed on the first interlayer insulating layer 74. The second interlayer insulating layer 75 is formed on the connection wires 73. A plurality of first via holes 71 are opened on the second interlayer insulating layer 75. The second connection terminals 72 are disposed on the second interlayer insulating layer 75 and are electrically connected to the connection wires 73 through the first via holes 71. The sealing adhesive layer 76 is disposed between the second interlayer insulating layer 75 and the display substrate 1, and the sealing adhesive layer 76 wraps the second connection terminal 72 and the first connection terminal 2. The connection wires 73 are electrically connected to the second connection terminals 72.

The sealing adhesive layer 76 is used to bond the display assembly 110 and the driving back plate 120 and fix the first connection terminal 2 and the second connection terminal 72. In this embodiment, the sealing adhesive layer 76 is an anisotropic conductive film (ACF)

Specifically, the driving integrated circuit 130 is located in the non-display area 102 and is electrically connected to the connecting wire 73. Orthographic projections of the driving integrated circuit 130 and the connecting wires 73 on the substrate layer 60 do not overlap each other. The driving integrated circuit 130 sequentially transmits signals to the second connection terminals 72, the first connection terminals 2, and the display substrate 1 through the connection wires 73 to drive the display substrate 1 to emit light.

Referring to FIGS. 2 and 3, in this embodiment, the driving backplane 120 further includes a substrate layer 60, and the communication circuit layer 70 and the driving integrated circuit 130 are both formed on the substrate layer 60. Specifically, the first interlayer insulating layer 74 is formed on the substrate layer 60, and the driving integrated circuit 130 is located in the non-display area 102 and located outside the communication circuit layer 70.

Material of the substrate layer 60 can be selected from materials such as at least one of glass, polyimide (PI), polyethylene terephthalate (PET), non-woven fabric, laminated film layer, etc.

Figure 4:
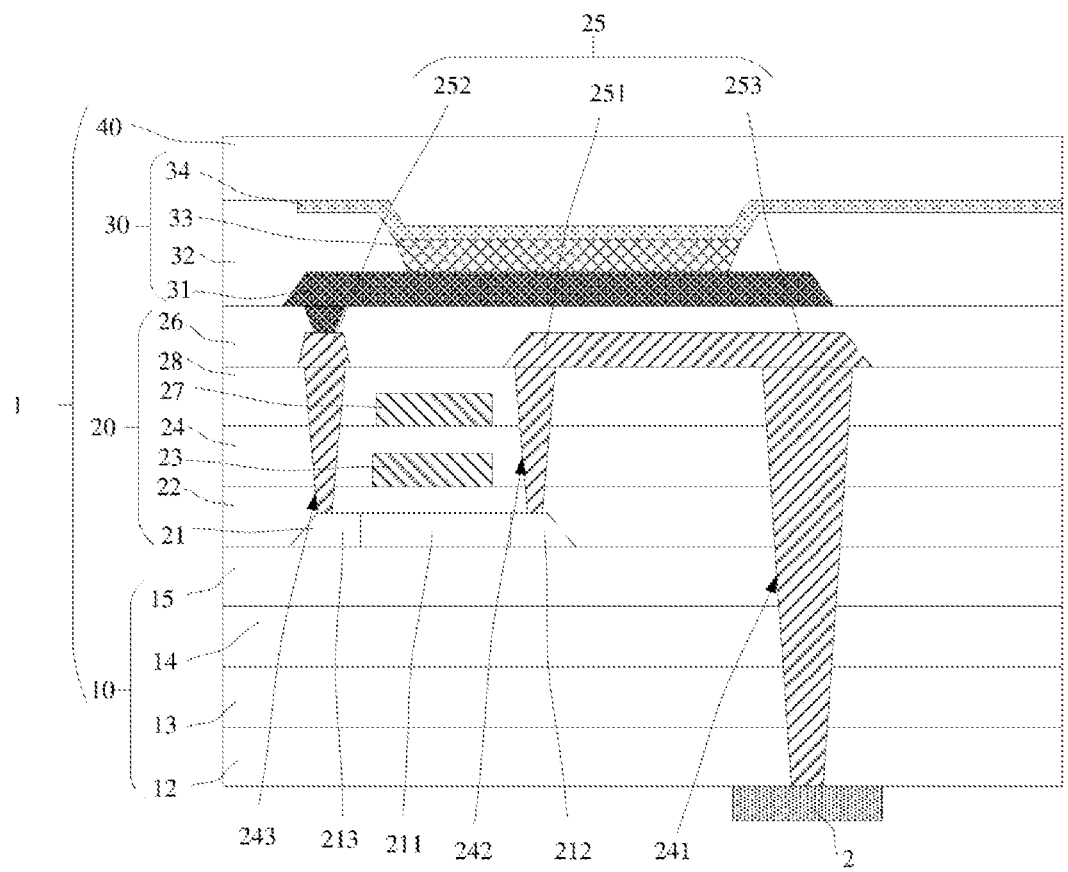
FIG. 4 is a detailed schematic diagram of films of the display assembly shown in FIG. 3.

Please refer to FIG. 4, the display substrate 1 includes: a base substrate 10, the driving circuit layer 20 and the light emitting function layer 30 disposed on a side of the base substrate 10 away from the driving backplane 120. The first connection terminals 2 are located on a surface of the base substrate 10 facing the driving backplane 120 and is electrically connected to the light emitting function layer 30. The driving circuit layer 20 is used to provide a driving voltage to the light emitting function layer 30 to make the light emitting function layer 30 emit light. In order to protect the reliability of the light emitting function layer 30 and prevent water and oxygen intrusion from causing the light emitting function layer 30 to fail, the display assembly 110 further includes an encapsulation layer 40.

The base substrate 10 includes a first barrier layer 12 and a first substrate 13 laminated on the first connection terminals 2, and the first substrate 13 is located between the driving circuit layer 20 and the first barrier layer 12. In this embodiment, the first connection terminal 2 is disposed on the surface of the first barrier layer 12 away from the first substrate 13, and in other embodiments, the first barrier layer 12 may also cover the first connection terminals 2, and a lower surface of the first connection terminal 2 is exposed. That is, the first connection terminals 2 are embedded in the first barrier layer 12 and a lower surface of the first connection terminal 2 is exposed. The lower surface of the first connection terminals 2 refers to a surface of the first connection terminals 2 away from the first barrier layer 12, and the lower surface is exposed for electrical connection with the driving backplane 120. The first connection terminals 2 can be made of a metal or alloy or metal laminate structure, metal oxide, conductive oxide, etc., which has strong oxidation resistance and low resistivity, such as Mo, Al and other metals, so as to ensure stability of the first connection terminal 2 and the reliability of the connection with the driving backplane 120.

Optionally, the base substrate 10 further includes: a second barrier layer 14 disposed on a side of the first substrate 13 away from the first barrier layer 12; and a first buffer layer 15 disposed on a side of the second barrier layer 14 away from the first substrate 13. The first barrier layer 12, the second barrier layer 14, and the first buffer layer 15 can all be formed of inorganic materials such as silicon oxide (SiOx), silicon nitride (SiNx), silicon oxynitride (SiON), etc., so as to prevent undesirable impurities or contaminants (such as moisture, oxygen, etc.) from diffusing from the first substrate 13 into the devices that may be damaged by these impurities or contaminants. The material of the first substrate 13 includes flexible film materials such as polyimide (PI). At the same time, the first buffer layer 15 can also provide a flat top surface to facilitate the preparation of the driving circuit layer 20 on the base substrate 10. Of course, the base substrate 10 of the present application is not limited to this, and the base substrate 10 of the present application may include more or fewer inorganic film layers.

Optionally, in this embodiment, the driving circuit layer 20 is a transistor including a double gate structure. Specifically, the driving circuit layer 20 includes a first semiconductor layer 21, a third interlayer insulating layer 22, a first gate 23, a fourth interlayer insulating layer 24, a second gate 27, a fifth interlayer insulating layer 28, and a source-drain layer 25. The first semiconductor layer 21 is disposed on the base substrate 10. More specifically, the first semiconductor layer 21 is disposed on the first buffer layer 15. The first semiconductor layer 21 includes a channel region 211 and a source region 212 and a drain region 213 located on opposite sides of the channel region 211. The third interlayer insulating layer 22 covers the first semiconductor layer 21 and the base substrate 10. Of course, in other embodiments, the driving circuit layer 20 may also be a transistor including a single gate structure.

The first gate 23 is disposed on the third interlayer insulating layer 22, and the first gate 23 is disposed corresponding to the channel region 211 of the first semiconductor layer 21. The fourth interlayer insulating layer 24 covers the first gate 23 and the third interlayer insulating layer 22. The second gate 27 is disposed on the fourth interlayer insulating layer 24 and is disposed corresponding to the first gate 23. A capacitor is formed between the second gate 27 and the first gate 23. The fifth interlayer insulating layer 28 covers the second gate 27 and the fourth interlayer insulating layer 24. The source-drain layer 25 is disposed on the fifth interlayer insulating layer 28, and the source-drain layer 25 is patterned to form a source electrode 251, a drain electrode 252, a data line 253, etc. The source electrode 251 and the drain electrode 252 are respectively electrically connected to the source region 212 and the drain region 213 of the corresponding first semiconductor layer 21. The data line 253 is electrically connected to the corresponding first connection terminals 2.

Specifically, the driving circuit layer 20 further includes a second via 241. The second via hole 241 penetrates the fifth interlayer insulating layer 28, the fourth interlayer insulating layer 24, the third interlayer insulating layer 22, the first buffer layer 15, the second Barrier layer 14, said first substrate 13, and said first barrier layer 12, so as to expose part of an upper surface of the first connection terminals 2, an upper surface of the first connection terminals 2 refers to a surface parallel to the lower surface of the first connection terminals 2 opposite to each other. The data line 253 is electrically connected to the first connection terminals 2 through the second via hole 241, and the data line 253 is also electrically connected to the source electrode 251 or the drain electrode 252. The electrical connection between the data line 253 and the source electrode 251 is taken as an example for description.

Further, the driving circuit layer 20 further includes a third via hole 242 and a fourth via hole 243. The third via hole 242 and the fourth via hole 243 both penetrate the fifth interlayer insulating layer 28, the fourth interlayer insulating layer 24, and a part of the third interlayer insulating layer 22, so as to expose part of the first semiconductor layer 21 respectively. The source electrode 251 is electrically connected to the source region of the first semiconductor layer 21 through the third via hole 242. The drain electrode 252 is electrically connected to the drain region of the first semiconductor layer 21 through the fourth via hole 243.

At the same time, in order to provide a flat surface for the driving circuit layer 20, the driving circuit layer 20 further includes a planarization layer 26 covering the source-drain layer 25 and the fifth interlayer insulating layer 28.

Of course, the structure of the driving circuit layer 20 in this application is not limited to that illustrated in this embodiment. The driving circuit layer 20 of the present application may also include more or fewer films, and the positional relationship of each film is not limited to what is illustrated in this embodiment.

Specifically, the light emitting function layer 30 includes a pixel electrode 31, a pixel definition layer 32, a light emitting unit 33 and a cathode 34. The pixel electrode 31 is disposed on the planarization layer 26, and is electrically connected to the source electrode 251 or the drain electrode 252 through the via hole of the planarization layer 26. Of course, since this embodiment takes the electrical connection of the data line 253 and the source electrode 251 as an example, correspondingly, this embodiment takes the electrical connection of the pixel electrode 31 and the drain electrode 252 as an example. The pixel definition layer 32 is disposed on the pixel electrode 31 and the planarization layer 26, and the pixel definition layer 32 is patterned to form pixel openings. The pixel opening exposes a part of the pixel electrode 31 to define a setting area of the light emitting unit 33.

The light emitting unit 33 is formed of a light emitting material vapor-deposited or printed in the pixel opening of the pixel defining layer 32, and light emitting materials of different colors form the light emitting unit 33 of different colors. For example, the light emitting unit 33 may include: a red light emitting unit formed of a red light emitting material, a green light emitting unit formed of a green light emitting material, and a blue light emitting unit formed of a blue light emitting material. The red light emitting unit emits red light, the green light emitting unit emits green light, and the blue light emitting unit emits blue light.

The cathode 34 covers the light emitting unit 33 and the pixel definition layer 32. The light emitting unit 33 emits light under combined action of the pixel electrode 31 and the cathode 34, and the light emitting unit 33 of different colors emits light of different colors, thereby realizing the pixel display of the display assembly 110.

Optionally, the pixel electrode 31 may be a transparent electrode or a reflective electrode. If the pixel electrode 31 is a transparent electrode, the pixel electrode 31 may be formed of, for example, indium tin oxide (ITO), indium zinc oxide (IZO), ZnO, or $In_2O_3$. If the pixel electrode 31 is a reflective electrode, the pixel electrode 31 may include, for example, a reflective layer formed of Ag, Mg, Al, Pt, Pd, Au, Ni, Nd, Ir, Cr, or a combination thereof, and a reflective layer formed of ITO, IZO, ZnO, or $In_2O_3$ layer. However, the pixel electrode 31 is not limited thereto, and the pixel electrode 31 may be formed of various materials, and may also be formed in a single-layer or multi-layer structure.

It should be noted that whether the pixel electrode 31 is a transparent electrode or a reflective electrode depends on a light emitting direction of the spliced display panel 100. When the spliced display panel 100 adopts top emission, the pixel electrode 31 may be a transparent electrode or a reflective electrode. Of course, the utilization of light emitted by the light emitting unit 33 can be improved when the reflective electrode is used. When the spliced display panel 100 adopts bottom light emission, the pixel electrode 31 adopts a transparent electrode to increase the light transmittance. In this embodiment, the spliced display panel 100 adopts top-emitting light as an example. In this way, in order to increase the light transmittance, the cathode 34 needs to be formed of a transparent conductive material. For example, the cathode 34 may be formed of a transparent conductive oxide (TCO) such as ITO, IZO, ZnO, or $In_2O_3$.

Optionally, the light emitting functional layer 30 may also include: a hole injection layer (HIL, not shown) and a hole transport layer (HTL, not shown) disposed between the light emitting unit 33 and the pixel electrode 31; and an electron injection layer (EIL, not shown) and an electron transport layer (ETL, not shown) disposed between the light emitting unit 33 and the cathode 34. The hole injection layer receives the holes transmitted by the pixel electrode 31, and the holes are transmitted to the light emitting unit 33 through the hole transport layer. The electron injection layer receives the electrons transmitted by the cathode 34, and the electrons are transmitted to the light emitting unit 33 through the electron transport layer. Holes and electrons combine at the position of the light emitting unit 33 to generate excitons, and the excitons transition from an excited state to the ground state to release energy and emit light.

The encapsulation layer 40 covers the light emitting functional layer 30 and is used to protect the light emitting unit 33 of the light emitting functional layer 30 to prevent water and oxygen from invading and causing the light emitting unit 33 to fail. Optionally, the encapsulation layer 40 can be encapsulated by a thin film. For example, the encapsulation layer 40 may be a laminated structure formed by sequentially laminating three layers of films of a first inorganic encapsulating layer, an organic encapsulating layer, and a second inorganic encapsulating layer or may be a laminated structure of more layers.

In this embodiment, the display assembly 110 further includes a gate driving circuit (not shown), and the gate driving circuit is electrically connected to the driving circuit layer 20 for providing scanning signals.

In this embodiment, the spliced display panel 100 uses the driving integrated circuit 130 and the connection wires 73 to sequentially transmit the signals in the driving integrated circuit 130 to the second connection terminal 72, the first connection terminal 2, the driving circuit layer 20, and the light emitting function layer 30, and the spliced display panel 100 cooperates with the gate driving circuit in the display assembly 110 to drive the display assembly 110 to emit light. Since a plurality of display components 110 share a driving integrated circuit 130 in this embodiment, compared with a corresponding driving integrated circuit for each display component in the prior art, a frame area occupied by the driving integrated circuit can be effectively reduced. In addition, the connection wires 73 connecting the display assembly 110 and the driving integrated circuit 130 is provided on the communication circuit layer 70 of the driving backplane 120, which does not need to occupy the area of the frame area. Compared with the fan-out wiring connecting the display component and the driving integrated circuit in the prior art, which needs to occupy a certain frame area, the area of the peripheral circuit can be effectively reduced, so that small frame splicing display can be realized.

In an optional embodiment of the present application, the first connection terminals 2 and the second connection terminals 72 are electrically connected together by a conductive material 80.

In an optional embodiment of the present application, the conductive material 80 includes, but is not limited to, one or more of conductive adhesive film, conductive adhesive, metal solder, tin paste, liquid metal, and the like.

The conductive adhesive includes but is not limited to at least one of a polymer conductive adhesive and a conductive adhesive doped with conductive particles. The doped conductive particles include, but are not limited to, at least one of metal particles, graphene, carbon nanotubes, carbon fibers and other conductive particles, and at least one of a composite material composed of at least two of the conductive particles. The metal particles include but are not limited to one of metal single particles, metal alloy particles composed of at least two of the metal single particles, metal oxide particles composed of at least one of the metal single particles and oxygen, and metal composite materials. The metal single particles include, but are not limited to, conductive metal particles such as gold, silver, copper, and aluminum. The metal composite material may be made of the metal oxide, a metal composite material composed of at least two of the metal alloy and the metal single particles. The metal composite material may also be a metal composite material composed of different kinds of the metal oxides. The metal composite material may also be a metal composite material composed of different kinds of the metal alloys.

The metal solder is an alloy solder composed of at least two metals among Bi-based, In-based, Sn-based, and Pb-based metals.

Figure 5:
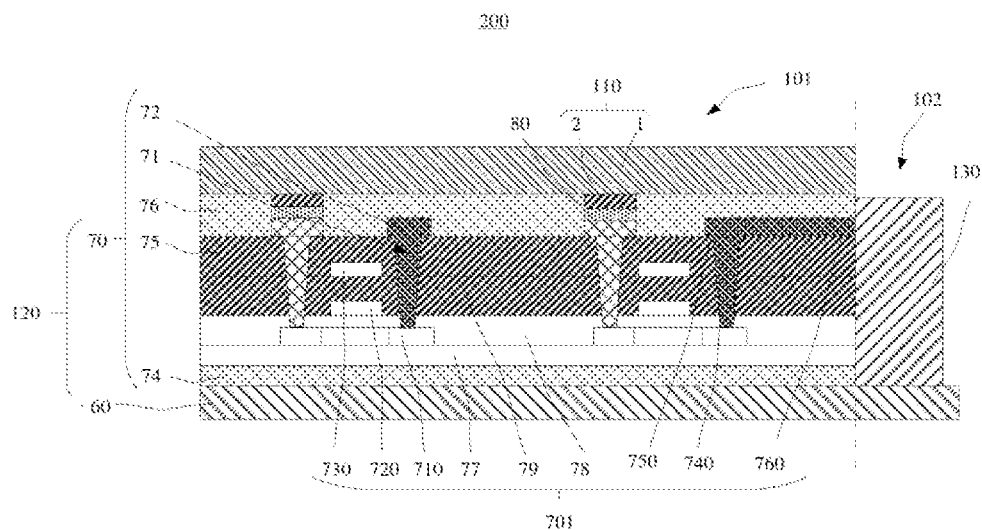
FIG. 5 is a simple cross-section of a spliced display panel with a film structure with a driving backplane provided by a second embodiment of the application.

Referring to FIG. 5, a second embodiment of the present application provides a spliced display panel 200. A structure of the spliced display panel 200 is similar to the structure of the spliced display panel 100, and the difference lies in that:

The communication circuit layer 70 of the spliced display panel 200 further includes a driving function layer 701 located in the display area 101. The driving function layer 701 is formed on the substrate layer 60 in the display area 101. The second connection terminal 72 is electrically connected to the driving function layer 701 through the first via hole 71. The driving integrated circuit 130 is electrically connected to the driving function layer 701. Orthographic projections of the driving integrated circuit 130 and the driving function layer 701 on the substrate layer 60 do not overlap each other.

In this embodiment, the driving function layer 701 includes a plurality of driving transistors having a double gate structure. Specifically, the driving function layer 701 includes: a second buffer layer 77 formed on the first interlayer insulating layer 74; a second semiconductor layer 710 formed on the second buffer layer 77; a sixth interlayer insulating layer 78 formed on the second buffer layer 77 and covering the second semiconductor layer 710; a third gate 720 formed on the sixth interlayer insulating layer 78 and positioned opposite to the second semiconductor layer 710; a seventh interlayer insulating layer 79 formed on the sixth interlayer insulating layer 78 and covering the third gate 720; and a fourth gate 730 formed on the seventh interlayer insulating layer 79. The second interlayer insulating layer 75 is formed on the seventh interlayer insulating layer 79 and covers the fourth gate 730. The first via hole 71 penetrates the second interlayer insulating layer 75, the seventh interlayer insulating layer 79, and a portion of the sixth interlayer insulating layer 78 and is electrically connected to the second semiconductor layer 710.

The driving function layer 701 further includes a plurality of fifth via holes 740, a plurality of third connection terminals 750 and fourth connection terminals 760 located at an end of the fifth via holes 740 away from the second semiconductor layer 710 and electrically connected to the fifth via holes 740. The fourth connection terminals 760 are extension of the third connection terminals 750 or both of which maintain electrical connection. The third connection terminals 750 and the second connection terminals 72 constitute the source electrode and drain electrode of the driving function layer 701. Each of the fifth via holes 740 penetrates the second interlayer insulating layer 75, the seventh interlayer insulating layer 79, and a portion of the sixth interlayer insulating layer 78, and each of the fifth via holes 740 is electrically connected to the second semiconductor layer 710. The driving integrated circuit 130 is electrically connected to the third connection terminals 750 through the fourth connection terminals 760.

In other embodiments, the driving function layer 701 may further include a driving transistor having a single gate structure.

In this embodiment, the driving integrated circuit 130 is located in the non-display area 102. The driving signal is transmitted into the display substrate 1 from the driving integrated circuit 130 sequentially through the fourth connection terminal 760, the third connection terminal 750, the fifth via holes 740, the second semiconductor layer 710, the first via hole 71, the second connection terminals 72, and the first connection terminals 2, so as to drive the display substrate 1 to emit light. In other embodiments, the structure of the driving function layer 701 is not limited to the structure described above.

Arranging the driving function layer 701 in the display area 101 can further reduce the area of the peripheral circuit and realize a narrow border spliced display.

Figure 6:
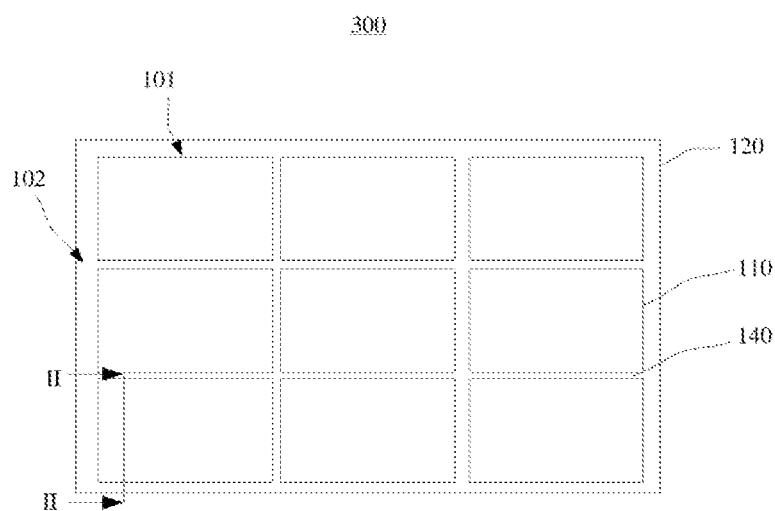
FIG. 6 is a top view of the spliced display panel provided by a third embodiment of the application.
Figure 7:
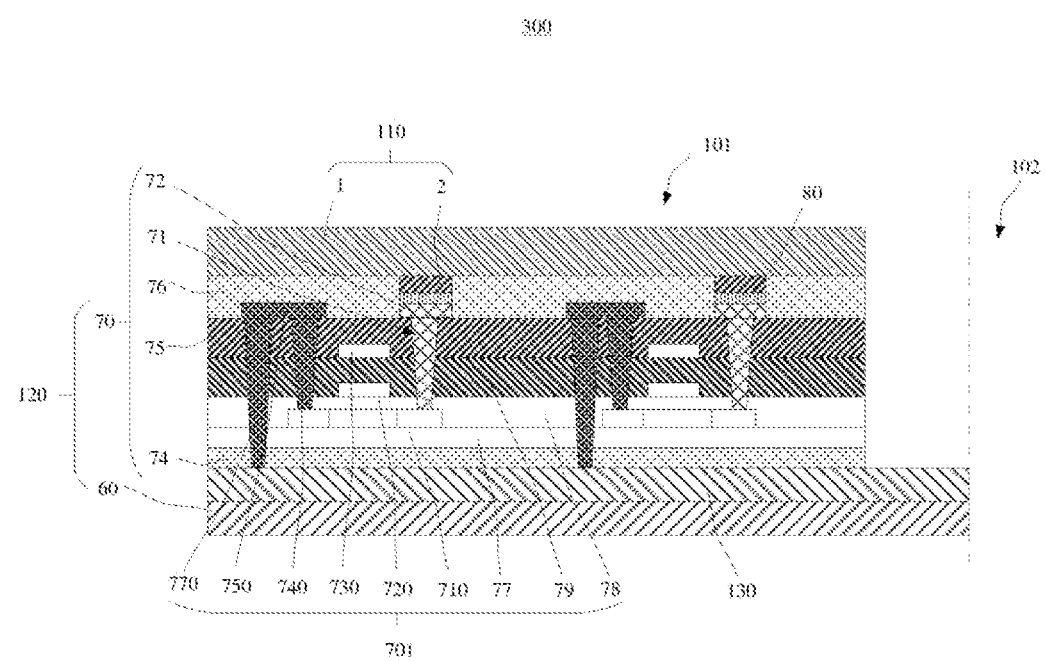
FIG. 7 is a simple cross-sectional schematic diagram of the spliced display panel shown in FIG. 6.

Referring to FIGS. 6-7, a third embodiment of the present application provides a spliced display panel 300. The structure of the spliced display panel 300 is similar to the structure of the spliced display panel 200, and the difference lies in that: the driving function layer 701 does not include the fourth connection terminal 760; the driving integrated circuit 130 is disposed on the substrate layer 60 in the display area 101, and the communication circuit layer 70 is located on the driving integrated circuit 130. Specifically, the first interlayer insulating layer 74 is located on the driving integrated circuit 130. The driving function layer 701 is electrically connected to the driving integrated circuit 130. The second connection terminal 72 is electrically connected to the driving function layer 701. The driving function layer 701 serves as a gate driving circuit (GOA circuit) of the spliced display panel 300.

Specifically, the driving function layer 701 further includes a plurality of sixth via holes 770. Each of the sixth via holes 770 is electrically connected to one of the third connection terminals 750, penetrates the second interlayer insulating layer 75, the seventh interlayer insulating layer 79, the sixth interlayer insulating layer 78, the second buffer layer 77, and the first interlayer insulating layer 74, and is electrically connected with the driving integrated circuit 130.

In this embodiment, by arranging the driving function layer 701 in the display area 101, and simultaneously forming the driving integrated circuit 130 in the form of a film on the substrate layer 60 in the display area 101, it can further reduce the area of the peripheral circuit, so as to realize the narrow border splicing display.

Figure 8:
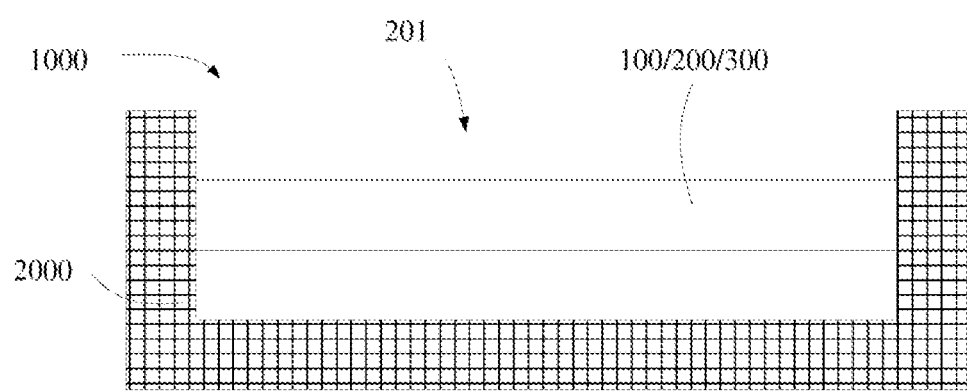
FIG. 8 is a cross-sectional view of a display device provided by this application.

Referring to FIG. 8, the present application also provides a display device 1000. The display device 1000 includes a housing 2000 and the spliced display panel 100, 200, or 300 of one of the above embodiments, the housing 2000 is formed with a receiving cavity 201, and the spliced display panel 100, 200, or 300 is arranged in the receiving cavity 201. In the spliced display panel of the display device provided in this application, multiple display components with light emitting function are bound to the driving backplane with driving function, the first connection terminals are disposed on the display assembly, the second connection terminals are disposed on the driving backplane, the second connection terminal is electrically connected to the first connection terminal, and the driving integrated circuit is electrically connected to the second connection terminal. Therefore, the signal in the driving integrated circuit is transmitted to the display component to drive the display component to emit light, such that there are fewer splicing processes, and multiple display components can be spliced together easily.

In addition, by not providing a driving function layer in the driving backplane, but by providing a driving integrated circuit and connecting wires in the driving backplane, the signals in the driving integrated circuit are sequentially transmitted to the second connection terminal, the first connection terminal, the driving circuit layer, and the light emitting function layer through the driving integrated circuit and the connection wires, and the signals cooperate with the gate driving circuit in the display assembly to drive the display assembly to emit light. Since multiple display components share one driving integrated circuit, compared to the corresponding driving integrated circuit provided for each display component in the prior art, the frame area occupied by the driving integrated circuit can be effectively reduced. In addition, the connecting wires connecting the display components and the driving integrated circuit are arranged on the communication circuit layer of the driving backplane, which does not need to occupy the area of the frame area.

Compared with the fan-out wiring that connects the display component and the driving integrated circuit in the prior art, which needs to occupy a certain frame area, the present disclosure can effectively reduce the area of the peripheral circuit, thereby enabling small frame splicing display.

In addition, arranging the driving function layer in the display area can further reduce the area of the peripheral circuit, and realize narrow border splicing display.

Moreover, by arranging the driving function layer in the display area, and simultaneously forming the driving integrated circuit in the form of a film on the substrate in the display area, the area of the peripheral circuit can be further reduced. The area of peripheral circuits can be further reduced, and narrow border splicing display can be realized.

From above, although the present disclosure has been disclosed as above in preferred embodiments, the above-mentioned preferred embodiments are not intended to limit the present disclosure. Those of ordinary skill in the art can make various changes and modifications without departing from the spirit and scope of the present disclosure. Therefore, the protection scope of the present disclosure is subject to the scope defined by the claims.

The invention claimed is:

1. A spliced display panel, comprising:
    a display assembly, wherein the display assembly comprises a display substrate and a plurality of first connection terminals electrically connected to the display substrate;
    a driving backplane, wherein the display assembly is arranged on the driving backplane, the driving backplane comprises a communication circuit layer, and the communication circuit layer comprises a plurality of second connection terminals bound to the first connection terminals; and
    a driving integrated circuit electrically connected to the second connection terminals,
    wherein the driving integrated circuit sequentially transmits signals to the first connection terminals and the display substrate through the second connection terminals to drive the display substrate, so as to drive the display substrate to emit light;
    the spliced display panel further comprises a display area and a non-display area located outside the display area, the communication circuit layer and the display component are both located in the display area, and the driving backplane further comprises a substrate layer, wherein the communication circuit layer and the driving integrated circuit are both formed on the substrate layer; and
    the communication circuit layer further comprises connection wires located in the display area, a first interlayer insulating layer and a second interlayer insulating layer, the first interlayer insulating layer is formed on the substrate layer, the connection wires are formed on the first interlayer insulating layer, the second interlayer insulating layer is formed on the connection wires, the second connection terminals are electrically connected to the connection wires and the second connection terminals through a first via hole penetrating the second interlayer insulating layer, the driving integrated circuit is located in the non-display area and is electrically connected to the connection wires, and orthographic projections of the driving integrated circuit and the connection wires on the substrate layer do not overlap each other.

2. The spliced display panel according to claim 1, wherein the first connection terminals and the second connection terminals are electrically connected together by a conductive material.

3. The spliced display panel according to claim 2, wherein the conductive material is one or more of conductive adhesive film, conductive adhesive, metal solder, tin paste, and liquid metal.

4. The spliced display panel according to claim 3, wherein the conductive adhesive is a polymer conductive adhesive or a conductive adhesive doped with conductive particles.

5. The spliced display panel according to claim 4, wherein the doped conductive particles are one of metal particles, graphene, carbon nanotubes, and carbon fibers; wherein the metal particles comprise: metal single particles; metal alloy particles composed of at least two of the metal single particles; metal oxide particles composed of at least one of the metal single particles and oxygen and a metal composite material, where the metal single particles comprise one of gold, silver, copper, and aluminum, and the metal composite material is composed of a metal oxide; a composite material composed of at least two of metal alloys and metal single particles, composite materials composed of different types of metal oxides, or composite materials composed of different types of metal alloys.

6. The spliced display panel according to claim 3, wherein the metal solder is an alloy solder composed of at least two metals among Bi-based, In-based, Sn-based, and Pb-based metals.

7. The spliced display panel according to claim 1, wherein:
the display substrate comprises:
a base substrate;
a driving circuit layer disposed on a side of the base substrate away from the driving backplane, wherein the driving circuit layer is electrically connected to the first connection terminals; and
a light emitting functional layer, wherein the first connection terminals are located on a surface of the base substrate facing the driving backplane and are electrically connected to the light emitting functional layer.

8. The spliced display panel according to claim 1, wherein the communication circuit layer further comprises a driving function layer located in the display area, the second connection terminals are electrically connected to the driving function layer through a first via hole opened in the communication circuit layer, the driving integrated circuit is located in the non-display area and is in electrical contact with the driving function layer, and orthographic projections of the driving integrated circuit and the driving function layer on the substrate layer do not overlap each other.

9. The spliced display panel according to claim 1, wherein the communication circuit layer further comprises a driving function layer located in the display area, the second connection terminal is electrically connected to the driving function layer through the first via hole, the driving integrated circuit is formed on the substrate layer located in the display area, the communication circuit layer is located on the driving integrated circuit and the communication circuit layer is further provided with a second via hole, and the driving integrated circuit is electrically connected to the driving function layer through the second via hole.

10. A display device, comprising:
a housing with a receiving cavity; and
a spliced display panel arranged in the receiving cavity, wherein the spliced display panel comprises:
a display assembly, wherein the display assembly comprises a display substrate and a plurality of first connection terminals electrically connected to the display substrate;
a driving backplane, wherein the display assembly is arranged on the driving backplane, the driving backplane comprises a communication circuit layer, and the communication circuit layer comprises a plurality of second connection terminals bound to the first connection terminals; and
a driving integrated circuit electrically connected to the second connection terminals,
wherein the driving integrated circuit sequentially transmits signals to the first connection terminals and the display substrate through the second connection terminals to drive the display substrate, so as to drive the display substrate to emit light;
the spliced display panel further comprises a display area and a non-display area located outside the display area, the communication circuit layer and the display component are both located in the display area, and the driving backplane further comprises a substrate layer, wherein the communication circuit layer and the driving integrated circuit are both formed on the substrate layer; and
the communication circuit layer further comprises connection wires located in the display area, a first interlayer insulating layer and a second interlayer insulating layer, the first interlayer insulating layer is formed on the substrate layer, the connection wires are formed on the first interlayer insulating layer, the second interlayer insulating layer is formed on the connection wires, the second connection terminals are electrically connected to the connection wires and the second connection terminals through a first via hole penetrating the second interlayer insulating layer, the driving integrated circuit is located in the non-display area and is electrically connected to the connection wires, and orthographic projections of the driving integrated circuit and the connection wires on the substrate layer do not overlap each other.

11. The display device according to claim 10, wherein the first connection terminals and the second connection terminals are electrically connected together by a conductive material.

12. The display device according to claim 11, wherein the conductive material is one or more of conductive adhesive film, conductive adhesive, metal solder, tin paste, and liquid metal.

13. The display device according to claim 12, wherein the conductive adhesive is a polymer conductive adhesive or a conductive adhesive doped with conductive particles.

14. The display device according to claim 13, wherein the doped conductive particles are one of metal particles, graphene, carbon nanotubes, and carbon fibers; wherein the metal particles comprise: metal single particles; metal alloy particles composed of at least two of the metal single particles; metal oxide particles composed of at least one of the metal single particles and oxygen and a metal composite material, where the metal single particles comprise one of gold, silver, copper, and aluminum, and the metal composite material is composed of a metal oxide; a composite material composed of at least two of metal alloys and metal single particles, composite materials composed of different types of metal oxides, or composite materials composed of different types of metal alloys.

15. The display device according to claim 12, wherein the metal solder is an alloy solder composed of at least two metals among Bi-based, In-based, Sn-based, and Pb-based metals.

16. A spliced display panel, comprising:
 a display assembly, wherein the display assembly comprises a display substrate and a plurality of first connection terminals electrically connected to the display substrate;
 a driving backplane, wherein the display assembly is arranged on the driving backplane, the driving backplane comprises a communication circuit layer, and the communication circuit layer comprises a plurality of second connection terminals bound to the first connection terminals; and
 a driving integrated circuit electrically connected to the second connection terminals,
 wherein the driving integrated circuit sequentially transmits signals to the first connection terminals and the display substrate through the second connection terminals to drive the display substrate, so as to drive the display substrate to emit light;
 the spliced display panel further comprises a display area and a non-display area located outside the display area, the communication circuit layer and the display component are both located in the display area, and the driving backplane further comprises a substrate layer, wherein the communication circuit layer and the driving integrated circuit are both formed on the substrate layer; and
 the communication circuit layer further comprises a driving function layer located in the display area, the second connection terminal is electrically connected to the driving function layer through a first via hole, the driving integrated circuit is formed on the substrate layer located in the display area, the communication circuit layer is located on the driving integrated circuit and the communication circuit layer is further provided with a second via hole, and the driving integrated circuit is electrically connected to the driving function layer through the second via hole.

17. The spliced display panel according to claim 16, wherein the first connection terminals and the second connection terminals are electrically connected together by a conductive material.

18. The spliced display panel according to claim 17, wherein the conductive material is one or more of conductive adhesive film, conductive adhesive, metal solder, tin paste, and liquid metal.

19. The spliced display panel according to claim 18, wherein the conductive adhesive is a polymer conductive adhesive or a conductive adhesive doped with conductive particles.

20. The spliced display panel according to claim 16, wherein:
 the display substrate comprises:
 a base substrate;
 a driving circuit layer disposed on a side of the base substrate away from the driving backplane, wherein the driving circuit layer is electrically connected to the first connection terminals; and
 a light emitting functional layer, wherein the first connection terminals are located on a surface of the base substrate facing the driving backplane and are electrically connected to the light emitting functional layer.

* * * * *